(12) United States Patent
Jacob et al.

(10) Patent No.: US 11,852,951 B2
(45) Date of Patent: Dec. 26, 2023

(54) TERAHERTZ ILLUMINATION SOURCE FOR TERAHERTZ IMAGING

(71) Applicant: INSTITUT NATIONAL D'OPTIQUE, Québec (CA)

(72) Inventors: Michel Jacob, Québec (CA); Michel Doucet, Saint-Augustin-de-Desmaures (CA); André Fougeres, Neuville (CA)

(73) Assignee: INSTITUT NATIONAL D'OPTIQUE, Québec (CA)

( * ) Notice: Subject to any disclaimer, the term of this patent is extended or adjusted under 35 U.S.C. 154(b) by 588 days.

(21) Appl. No.: 16/998,052

(22) Filed: Aug. 20, 2020

(65) Prior Publication Data

US 2021/0055624 A1 Feb. 25, 2021

Related U.S. Application Data

(60) Provisional application No. 62/890,912, filed on Aug. 23, 2019.

(51) Int. Cl.

| | |
|---|---|
| *G01N 21/3581* | (2014.01) |
| *G02F 1/29* | (2006.01) |
| *H01L 33/00* | (2010.01) |
| *G01S 13/88* | (2006.01) |
| *G01S 13/89* | (2006.01) |

(52) U.S. Cl.
CPC ......... *G02F 1/292* (2013.01); *G01N 21/3581* (2013.01); *G01S 13/887* (2013.01); *G01S 13/89* (2013.01); *H01L 33/002* (2013.01); *G02F 2203/13* (2013.01); *G02F 2203/24* (2013.01)

(58) Field of Classification Search
CPC .. G02F 1/292; G02F 2203/13; G02F 2203/24; G01N 21/3581; G01S 13/887; G01S 13/89; H01L 33/002
See application file for complete search history.

(56) References Cited

U.S. PATENT DOCUMENTS

| | | | |
|---|---|---|---|
| 6,777,684 B1 | 8/2004 | Volkov et al. | |
| 9,617,594 B2* | 4/2017 | Rothberg | ............. C12Q 1/6869 |
| 10,176,991 B1* | 1/2019 | Lagally | ............... H01L 29/1054 |

(Continued)

*Primary Examiner* — David P Porta
*Assistant Examiner* — Mamadou Faye
(74) *Attorney, Agent, or Firm* — Reno Lessard; Norton Rose Fulbright Canada LLP

(57) ABSTRACT

There is described a terahertz illumination source for terahertz imaging. The terahertz illumination source generally has: a surface; a plurality of terahertz radiation emitting elements mounted to said surface; a plurality of individual beam shaping elements each being optically coupled to a respective one of said terahertz radiation emitting elements; a collective beam shaper optically coupled to at least some of said individual beam shaping elements; and a control signal generator communicatively coupled to said terahertz radiation emitting elements, said control signal generator supplying a plurality of control signals to said terahertz radiation emitting elements, said terahertz radiation emitting elements emitting a plurality of individual terahertz radiation beams being collected and redirected successively by said individual beam shaping elements and said collective beam shaper, said terahertz radiation emitting elements and/or said control signals being configured so that said individual terahertz radiation beams are incoherent with respect to one another.

18 Claims, 11 Drawing Sheets

(56) References Cited

U.S. PATENT DOCUMENTS

2010/0002739 A1* 1/2010 Hu .......................... H01S 1/02
                                                        372/45.01
2014/0144009 A1   5/2014 Chattopadhyay et al.
2019/0391243 A1* 12/2019 Nicolaescu ........... G01S 7/4911
2021/0033769 A1*  2/2021 Menon ................... G03H 1/265

* cited by examiner

N = 45

N = 37

N = 91

1 x N

TERAHERTZ ILLUMINATION SOURCE FOR TERAHERTZ IMAGING

FIELD

The improvements generally relate to illuminating a scene with terahertz radiation, and more particularly relate to illuminating the scene with terahertz illumination having reduced coherence.

BACKGROUND

A terahertz (THz) illumination source is a device capable of emitting electromagnetic radiation of frequency ranging from 0.1 THz to 10 THz. An example of such a device is the vacuum-electron device (VED), which can radiate power in the order of watts at frequencies below 300 GHz and over an extremely narrow frequency band. Other examples of such a device can include terahertz radiation emitting semiconductor diodes like Schottky, Gunn and IMPATT diodes, which can radiate power up to a few hundreds of milliwatts at frequencies up to a few THz. However, such THz illumination sources are known to emit coherent terahertz radiation, which may be ill-suited in the context of terahertz imaging, as imaging a scene illuminated with coherent radiation can lead to speckled images. Although existing THz illumination sources have been satisfactory to a certain degree, there remains room for improvement.

SUMMARY

For applications in the fields of inspection, diagnosis or screening, it was found that terahertz imaging would benefit from incorporating THz illuminating sources with an inherently reduced beam coherence in order to enable as much clarity as possible in the resulting images. Such clarity can be paramount for real-time diagnosis in biomedical imaging, industrial quality control, for the detection of concealed weapons in airports or other public premises where huge crowds gather or transit, or for the inspection in mailrooms of envelopes or parcels that could contain explosives, chemical or biological threats in the form of liquids or powders.

VEDs can suffer from a relatively low lifetime of their vacuum tube, can require relatively high-voltage power supplies, can have relatively low efficiency, and can also require liquid cooling. Moreover, in the context of terahertz imaging, the coherence of the terahertz illumination beam emitted by such VEDs may be reduced by using moving path-dispersive optical elements such as rotating diffusers, which can be inconvenient due to the inherent drawbacks generally associated with having a device with moving parts. Similarly, terahertz radiation emitting semiconductor diodes have a relatively limited capability of reducing the coherence of the terahertz illumination beam by electronic means.

In an aspect, it was found that a need exists in providing a THz illumination source which can emit a terahertz illumination beam having reduced coherence, e.g., having a coherence length below a coherence length threshold, without necessarily using external coherence breaking devices such as passive or active optical path scrambling devices (e.g., metamaterial, diffuser, light pipe, integrating sphere, non-imaging optics). By doing so, imaging a scene illuminated with such a reduced coherence terahertz illumination beam can lead to images with reduced coherent noise and improved overall quality.

In accordance with a first embodiment of the present disclosure, there is provided a terahertz illumination source for terahertz imaging. The terahertz illumination source comprises a surface, a plurality of terahertz radiation emitting elements mounted to the surface, and a control signal generator communicatively coupled to the plurality of terahertz radiation emitting elements. The control signal generator supplies a plurality of control signals to the plurality of terahertz radiation emitting elements. When driven in this way, the plurality of terahertz radiation emitting elements emit a plurality of individual terahertz radiation beams collectively forming a terahertz illumination beam having a controlled coherence property. For instance, the coherence property may be controlled to be below a coherence property threshold. Examples of the coherence property can include, but not limited to, spatial coherence properties, temporal coherence properties and the like.

Further in accordance with the first embodiment of the present disclosure, the control signals can be for example different from one another so as to provide individual terahertz radiation beams of different wavelengths, thereby reducing the coherence of the overall terahertz illumination beam.

Still further in accordance with the first embodiment of the present disclosure, at least some of the terahertz radiation emitting elements can be for example configured to emit individual terahertz radiation beams of different spectral contents, thereby reducing the coherence of the terahertz illumination beam.

Still further in accordance with the first embodiment of the present disclosure, the terahertz radiation emitting elements can for example include high electron-mobility semiconductor materials such as silicon-germanium (Si—Ge).

In accordance with a second embodiment of the present disclosure, there is provided a terahertz imaging system. The terahertz imaging system comprises a terahertz illumination source, a terahertz camera and possibly also, a computer for controlling the operation of the source, the camera, and for receiving and displaying the images captured by the camera. The terahertz illumination source has a plurality of terahertz radiation emitting elements, and a control signal generator is communicatively coupled to the plurality of terahertz radiation emitting elements. The control signal generator supplies a plurality of control signals to the plurality of terahertz radiation emitting elements. When driven in this way, the plurality of terahertz radiation emitting elements emit a plurality of individual terahertz radiation beams collectively forming a terahertz illumination beam illuminating a scene and having a controlled coherence property. The coherence property may be controlled to be below a coherence property threshold. The terahertz camera can image at least a portion of the scene illuminated by the field of illumination and provide images with reduced coherent noise.

Further in accordance with the second embodiment of the present disclosure, the control signals can be for example different from one another so as to provide individual terahertz radiation beams of different wavelengths, thereby reducing the coherence of the terahertz illumination beam.

Still further in accordance with the second embodiment of the present disclosure, at least some of the terahertz radiation emitting elements can be for example configured to emit individual terahertz radiation beams of different spectral contents, thereby reducing the coherence of the terahertz illumination beam.

Still further in accordance with the second embodiment of the present disclosure, the terahertz radiation emitting elements can for example include high electron-mobility semiconductor materials such as silicon-germanium (Si—Ge).

Another aspect relating to existing THz illumination sources is that both VEDs and terahertz radiation emitting semiconductor diodes are generally produced in small volumes by way of tedious, complex and long lead-time manufacturing processes that can require high mechanical precision, highly-skilled personnel and very technology-specific and hard-to-find components. Thus, efficient and low-lead time, high-volume automated manufacturing is still quasi-absent in the field of THz illumination sources.

It was found that a need exists in providing a THz illumination source which can take advantage of recent technological advances in the field of high electron-mobility semiconductor materials like, for example, silicon-germanium (Si—Ge). Such materials open a radically new perspective in the manufacturing of THz illumination sources since it can allow using the high-volume, ultra-automated and ultra-efficient manufacturing processes that prevail at every stage of the production of electronic devices, from wafer to printed-circuit board assembly.

In another aspect, it was found that a need exists in providing a terahertz illumination beam having an increased beam shaping capability, a controlled coherence and/or a phased-array signature.

In accordance with a third aspect of the present disclosure, there is provided a terahertz illumination source for terahertz imaging, the terahertz illumination source comprising: a surface; a plurality of terahertz radiation emitting elements mounted to said surface; a plurality of individual beam shaping elements each being optically coupled to a respective one of said terahertz radiation emitting elements; a collective beam shaper optically coupled to at least some of said individual beam shaping elements; and a control signal generator communicatively coupled to said terahertz radiation emitting elements, said control signal generator supplying a plurality of control signals to said terahertz radiation emitting elements, said plurality of terahertz radiation emitting elements emitting a plurality of individual terahertz radiation beams being collected and redirected successively by said individual beam shaping elements and said collective beam shaper, at least one of said terahertz radiation emitting elements and said control signals being configured so that said individual terahertz radiation beams are incoherent with respect to one another.

Further in accordance with the third aspect of the present disclosure, at least one of said individual beam shaping elements and said collective beam shaper can for example be refractive.

Still further in accordance with the third aspect of the present disclosure, said individual beam shaping elements can for example be stacked on respective ones of said individual terahertz radiation emitting elements.

Still further in accordance with the third aspect of the present disclosure, said collective beam shaper can for example be stacked on corresponding individual beam shaping elements.

Still further in accordance with the third aspect of the present disclosure, said individual terahertz illumination beams can for example form a terahertz illumination beam having a nominal wavelength and a coherence length below about a hundred times said nominal wavelength.

Still further in accordance with the third aspect of the present disclosure, said control signals can for example be different from one another so as to provide individual terahertz radiation beams of different wavelengths thereby reducing said coherence of said terahertz illumination beam.

Still further in accordance with the third aspect of the present disclosure, at least some of said terahertz radiation emitting elements can for example be configured to emit individual terahertz radiation beams of different spectral contents thereby reducing said coherence of said terahertz illumination beam.

Still further in accordance with the third aspect of the present disclosure, said terahertz radiation emitting elements can for example include a high-electron-mobility semiconductor material.

In accordance with a fourth aspect of the present disclosure, there is provided a terahertz illumination source for terahertz imaging, the terahertz illumination source comprising: a surface; a plurality of terahertz radiation emitting elements mounted to said surface; and a control signal generator communicatively coupled to said terahertz radiation emitting elements, the control signal generator supplying a plurality of control signals to said terahertz radiation emitting elements, said plurality of terahertz radiation emitting elements emitting a plurality of individual terahertz radiation beams, the control signal generator modulating a phase of said individual terahertz illumination beams to control a resulting, collective terahertz illumination beam.

Further in accordance with the fourth aspect of the present disclosure, said modulating can for example cause said collective terahertz illumination beam to be steered towards a target.

Still further in accordance with the fourth aspect of the present disclosure, said modulating can for example cause said collective terahertz illumination beam to be focused towards a target.

Still further in accordance with the fourth aspect of the present disclosure, said terahertz radiation emitting elements can for example include a high-electron-mobility semiconductor material.

Still further in accordance with the fourth aspect of the present disclosure, the terahertz illumination source can for example further comprise a plurality of individual beam shaping elements each being optically coupled to a respective one of said terahertz radiation emitting elements, and a collective beam shaper optically coupled to at least some said individual beam shaping elements, said individual terahertz radiation beams being collected and shaped successively by said individual beam shaping elements and said collective beam shaper.

Still further in accordance with the fourth aspect of the present disclosure, at least one of said individual beam shaping elements and said collective beam shaper can for example be refractive.

Still further in accordance with the fourth aspect of the present disclosure, said individual beam shaping elements can for example be stacked on respective ones of said individual terahertz radiation emitting elements.

Still further in accordance with the fourth aspect of the present disclosure, said collective beam shaper can for example be stacked on corresponding individual beam shaping elements.

Still further in accordance with the fourth aspect of the present disclosure, the terahertz illumination source can for example further comprise a phase delayer receiving a main control signal from the control signal generator and generating the plurality of control signals based on the main control signal such that the plurality of control signals have phase delays relative to one another.

Still further in accordance with the fourth aspect of the present disclosure, the terahertz illumination source can for example further comprise a phase delayer receiving the plurality of control signals from the control signal generator and phase delaying the plurality of control signals from one another such that the plurality of control signals have phase delays relative to one another.

Many further features and combinations thereof concerning the present improvements will appear to those skilled in the art following a reading of the instant disclosure.

DESCRIPTION OF THE FIGURES

In the figures,

FIG. 5A shows an array having a density of terahertz radiation emitting elements increasing outwardly and FIG. 5B shows an array having a density of terahertz radiation emitting elements decreasing outwardly, in accordance with one or more embodiments;

DETAILED DESCRIPTION

Figure 1:
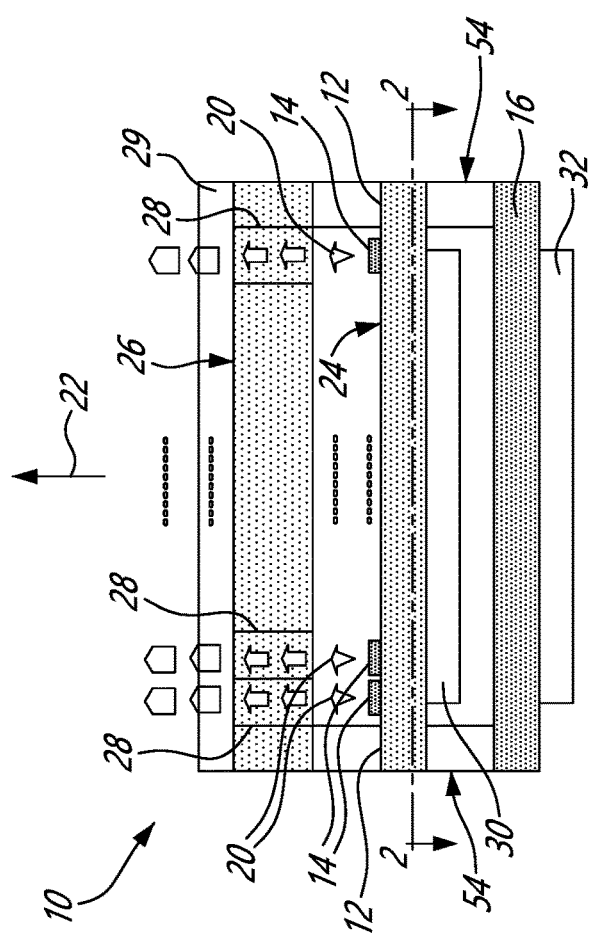
FIG. 1 is a block diagram of an example of a THz illumination source having a surface, an array of terahertz radiation emitting elements and a control signal generator, in accordance with one or more embodiments.

FIG. 1 shows an example of a terahertz illumination source 10, in accordance with an embodiment. As depicted, the terahertz illumination source 10 has a surface 12, terahertz radiation emitting elements 14 mounted to the surface 12, and a control signal generator 16 which is communicatively coupled to the terahertz radiation emitting elements 14. During use, the control signal generator 16 supplies control signals to the terahertz radiation emitting elements (hereinafter simply referred to as "THz emitting elements 14") such that they emit individual terahertz radiation beams 20 which collectively form a terahertz illumination beam 22.

As illustrated, the terahertz illumination source 10 has individual beam shaping elements 28 which are each optically coupled to a respective one of THz emitting elements 14. A collective beam shaper 29 is also optically coupled to at least some of the individual beam shaping elements 28. In some embodiments, such as the one illustrated in FIG. 1, each individual beam shaping element 28 is stacked on a respective one of the THz emitting elements 14, and the collective beam shaper 29 is in turn stacked on at least some of the individual beam shaping elements 28. As such, the individual terahertz radiation beams 20 are collected and redirected successively by the individual beam shaping elements 28 and the collective beam shaper 29 to form the terahertz illumination beam 22. It was found that the combination of individual and collective beam shaping elements can help in the control of optical aberrations, especially for large devices, which may allow to enhance the compactness of the optical sources and to reduce the overall complexity thereof. It can also allow to increase the diversity of ray directions and ray path lengths through the use of different beam shaping elements.

As discussed below, the THz emitting elements 14 and/or the control signals are configured so that said individual terahertz radiation beams 20 are incoherent with respect to one another. In some embodiments, the terahertz illumination source 10 is designed such that the terahertz illumination beam 22, which encompasses the collection of the individual terahertz radiation beams 20, has a nominal wavelength and a coherence property below a coherence property threshold. An example of such a property is the coherence length of the terahertz illumination beam 22. For instance, in some embodiments, the coherence length threshold can be in the order of about a hundred times the nominal wavelength of the terahertz illumination beam 22.

It is intended that the way of reducing the coherence of the terahertz illumination beam 22 can vary from one embodiment to another.

For instance, the control signals supplied to the THz emitting elements 14 can be different from one another so as to provide individual terahertz radiation beams 20 of different wavelengths. By doing so, the coherence of the terahertz illumination beam 22 can be reduced due to the superposition of the spectrally different individual terahertz radiation beams 20. In such embodiments, the control signal generator 16 can supply a first control signal to one of the THz emitting elements 14 to emit an individual terahertz radiation beam 20 of a first wavelength λ1, a second control signal to another one of the THz emitting elements 14 to emit an individual terahertz radiation beam 20 of a second wavelength λ2 (λ2≠λ1), and so forth, so that the individual terahertz radiation beams 20 are different from one another and that the coherence property of the terahertz illumination beam 22 is below the coherence property threshold.

Additionally, or alternately, the THz emitting elements 14 can be configured to emit individual terahertz radiation beams 20 of different wavelengths, thereby reducing the coherence of the terahertz illumination beam 22. It is understood that the THz emitting elements 14 can have different internal structures such as different antenna types (e.g., flat-type antennas, patch-type antennas and the like) with different dimensions and/or different shapes, different doping materials, different doping material ratios, encompassing different electronic components such as different transistors, amplifiers, frequency multipliers, or any other suitable emitting elements able to emit individual terahertz radiation beams 20 of different spectral contents. It is intended that the spectral content can differ in terms of wavelengths, wavelength bandwidths, and the like. In such embodiments, the terahertz illumination source 10 can have a first terahertz radiation emitting element 14 of a first internal structure S1 which when supplied with a control signal emits an individual terahertz radiation beam 20 of a first wavelength λ1, a second terahertz radiation emitting element 14 of a second internal structure S2 (S2≠S1) which when supplied with the control signal emits an individual terahertz radiation beam 20 of a second wavelength λ2 (λ2≠λ1), and so forth, so that the individual terahertz radiation beams 20 are different from one another and that the coherence property of the terahertz illumination beam 22 is below the coherence property threshold.

As shown in the embodiment illustrated in FIG. 1, the terahertz illumination source 10 can be made up of a stacked assembly of optical and electronic modules. For instance, the THz emitting elements 14 can be provided in the form of an array 24 stacked on the surface 12. The array 24 can be an M×N array of THz emitting elements 14, where M and N are integers greater than or equal to unity. In this embodiment, the terahertz illumination source 10 has a corresponding array 26 of beam shaping elements 28 stacked on, and optically coupled, to the THz emitting elements 14. A heat dissipation device 30 can be located close to, or attached to, the surface 12 and/or the array 24 of THz emitting elements 14. As shown, the control signal generator 16 is stacked under the surface 12 and in communication with other components of a terahertz imaging system such as a remote computer via electrical connectors 32.

Hence, and in contrast with existing terahertz illumination sources, the terahertz illumination source 10 does not necessarily have external components such as high-precision metallic components like an antenna and associated assembly apparatuses like waveguides, resonant cavities, etc.

Figure 2:
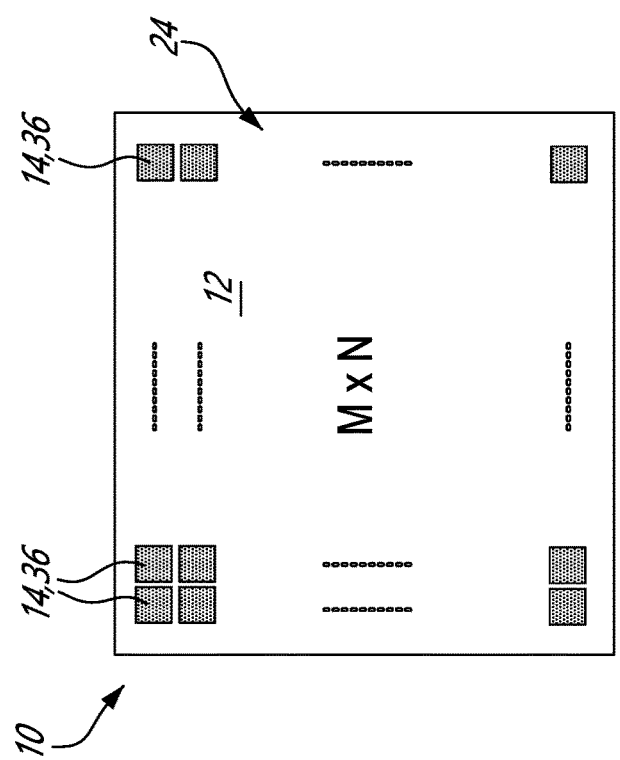
FIG. 2 is a top plan view of the array of terahertz radiation emitting elements of FIG. 1, taken along section 2-2 of FIG. 1, in accordance with one or more embodiments.

An objective of the M×N array 24 of THz emitting elements 14 is to output a THz illumination beam 22 with coherence reduced sufficiently for illuminating scenes appropriately in a THz active imaging system. As shown in FIG. 1, the electrical connection can be achieved through board-to-board connectors 54 located between the array 24 of THz emitting elements 14 and the control signal generator 16. As shown in FIG. 2, the array 24 is made up of M×N instances of a single THz emitting element 14. In some embodiments, each single THz emitting element 14 is packaged in an integrated circuit (IC) with a small footprint. In some other embodiments, each single terahertz emitting element can be provided in the form of a die with a possibly even smaller footprint. As can be understood, the array 24 of THz emitting elements 14 can have M×N IC's or alternatively, M×N dies. For clarity, any embodiment applicable for IC's can equivalently be applicable for dies.

Figure 3:
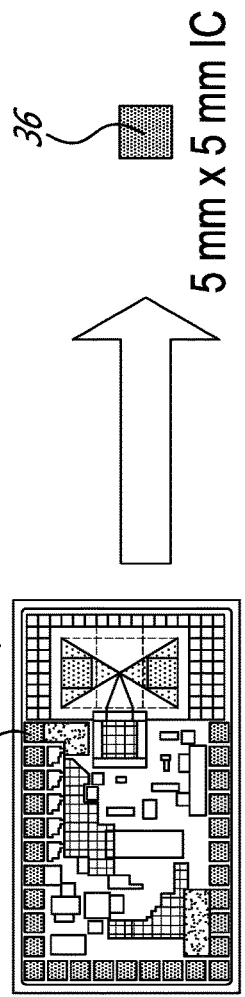
FIG. 3 is an enlarged view of one of the terahertz radiation emitting elements of FIG. 2, showing an example of a Si—Ge die on the left-hand side and the Si—Ge die packaged in an integrated circuit (IC) on the right-hand side, in accordance with one or more embodiments.

For example, a THz emitting element 14 can be implemented using the transmitter channel of a 285 GHz-325 GHz, Si—Ge radar transceiver component manufactured as part number TRA_300_030 by Silicon Radar (Frankfurt (Oder), Germany https://siliconradar.com/). The left-hand side of FIG. 3 shows an example of a die 34 (not-to-scale) of such transceiver, while the right-hand side of the figure shows a view of the same die packaged in an industry-standard, 5 mm×5 mm, 32-pin QFN square package 36. The internal structure of the THz emitting elements 14 can, of course, vary from one embodiment to another. Other examples of THz emitting elements similar to the Silicon Radar component described above and based also on high-electron-mobility semiconductor materials are likely to include devices such as resonant tunneling diodes (RTD's), heterojunction bipolar transistors (HBT's), high-electron-mobility transistors (HEMT's) or silicon complementary metal oxide semiconductor (Si-CMOS) transistors.

Each such THz emitting element 14 is capable of outputting an individual THz radiation beam 20 at a minimum of 100 µW of output power in this embodiment. The total power output of the terahertz illumination source 10 can therefore be the sum of the powers outputted by the M×N individual THz emitting elements 14.

Typically, the M×N array 24 of THz emitting elements 14 can be positioned in a pre-defined manner on an appropriate surface 12 such as an electronic printed circuit board. The THz emitting elements 14 can be soldered to the surface 12, or attached via known techniques such as flip-chip bonding or wire bonding. The array 24 of THz emitting elements 14 can be provided in the form of a regularly spaced grid of THz emitting elements 14 or a grid with a progressive variation in the spacing between consecutive THz emitting elements 14. The number, distances and spacings of a given array 24 can be designed to achieve any desired irradiance patterns.

It is noted that although FIG. 2 shows that the terahertz illumination source 10 has the M×N array 24 of THz emitting elements 14, the M×N array is only an embodiment to ease understanding. In fact, in some other embodiments, the THz emitting elements 14 need not to be positioned in an M×N array. For example, another embodiment of a terahertz illumination source 10 can have a plurality of THz emitting elements 14 mounted to a surface 12 such as a printed circuit board, where the THz emitting elements 14 are positioned in an arbitrary spatial distribution over the surface 12. In such case, the beam shaping elements 28 can be positioned in a corresponding arbitrary spatial distribution over the plurality of THz emitting elements 14. The number of beam shaping elements 28 can be the same as the number of THz emitting elements 14 in some embodiments whereas the number of beam shaping elements 28 can differ from the number of THz emitting elements 14 in some other embodiments.

Figure 4B:
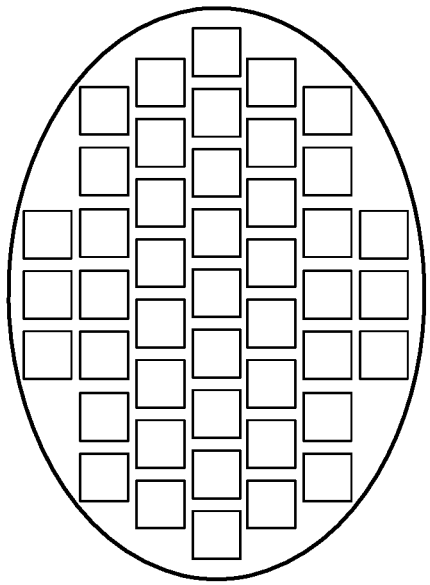
FIGS. 4A-4D are top plan views of example arrays of terahertz radiation emitting elements distributed in a respective one of a circular fashion, an elliptical fashion, a linear fashion and an hexagonal fashion, in accordance with one or more embodiments.
Figure 4D:
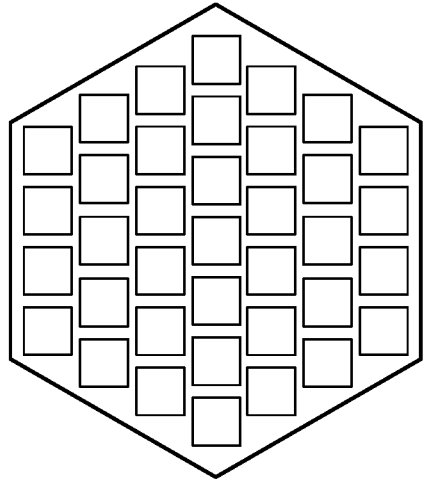
Figure 4A:
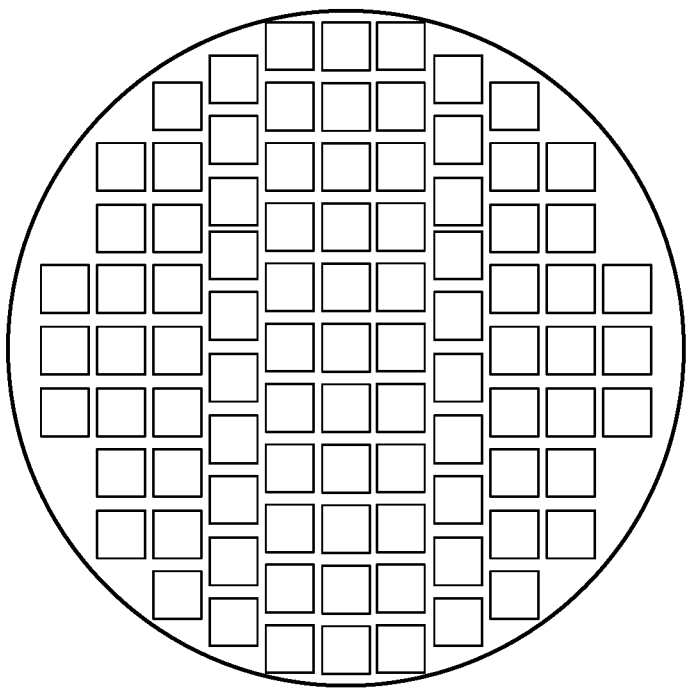
Figure 4C:

It is intended that a single THz emitting element 14 has a relatively small footprint that can enable the distribution of a number of instances not only as a regular M×N array 24 over a square surface 12, such as shown in FIG. 2, but also, as illustrated in FIGS. 4A-D, over any geometrical surfaces like, for example, a circular surface as shown in FIG. 4A, an elliptical surface as shown in FIG. 4B, a rectangular surface such as shown in FIG. 4C, an hexagonal surface such as shown in FIG. 4D, or on any other arbitrary surface.

Figure 5A:
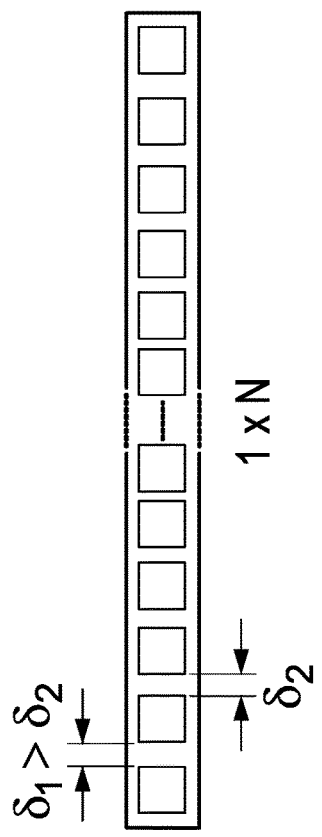
FIGS. 5A and 5B are top plan views of the array of terahertz radiation emitting elements of FIG. 4C, where
Figure 5B:
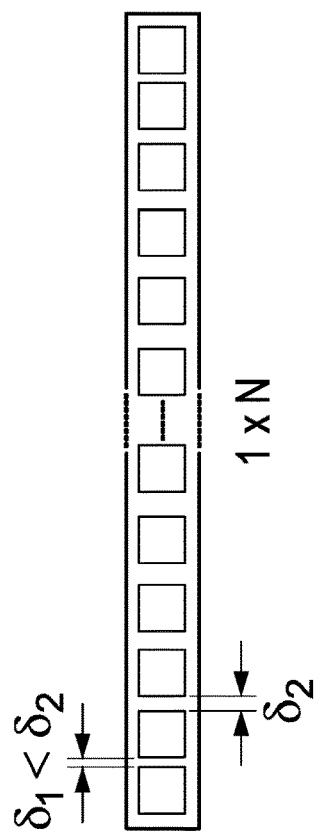

The small footprint feature of the THz emitting element 14 can also be used advantageously, for example in industrial quality-control or security screening applications where inspected objects are moving on a conveyor and a THz inspection system is implemented as a line-scan of the objects with an 1×N array of THz emitting elements 14 for the illumination. In such cases and in order to have a desired illumination distribution (either uniform or arbitrary) over the observed line surface, it is preferable that the placement density of the THz emitting elements 14 be variable over the length of the array, whether the density of THz emitting elements 14 be increased outwardly such as shown in FIG. 5A, or decreased outwardly such as shown in FIG. 5B. Other forms of linear distributions can be considered according to the application. In addition, such increasing, decreasing or arbitrary placement schemes can also be considered for 2-D geometries.

Figure 6:
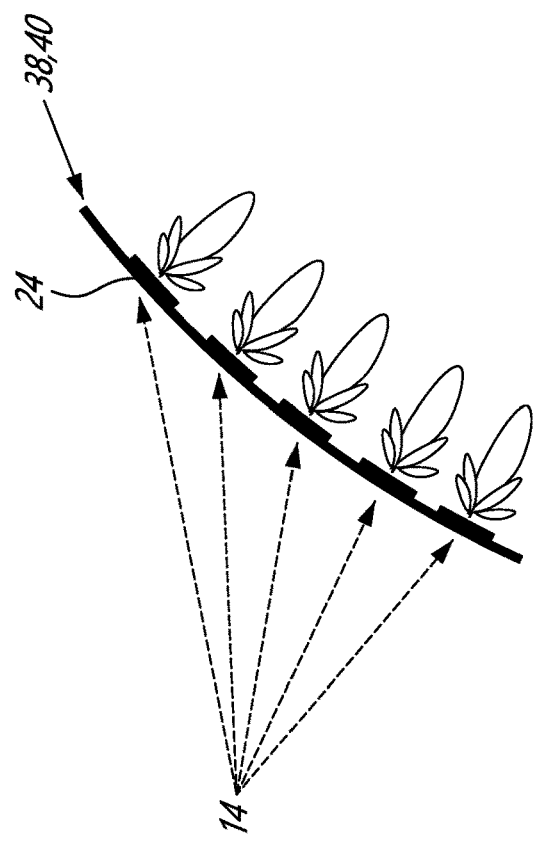
FIG. 6 is a side elevation view of an example array of terahertz radiation emitting elements mounted to a flexible printed circuit board, in accordance with one or more embodiments.

Still another advantage of having the array 24 of THz emitting elements 14 as a spatial distribution of small-footprint elementary emitters is that the THz emitting elements 14 can be installed even on a curved surface 38 such as a flexible electronic PCB 40 as illustrated in FIG. 6. Such feature may be much appreciated in space-critical applications.

Distributing the THz emitting elements 14 over a surface 12 as is done in the M×N array 24 can allow the use of time-saving, automated electronic assembly processes like component pick-and-place, flip chip, wire bonding, reflow soldering and the like. This can be a significant improvement over existing VED- and diode-based terahertz illumination sources where assembly processes are generally performed by hand and require highly-skilled personnel to execute high-precision, tedious and/or time-consuming tasks.

Figure 7:
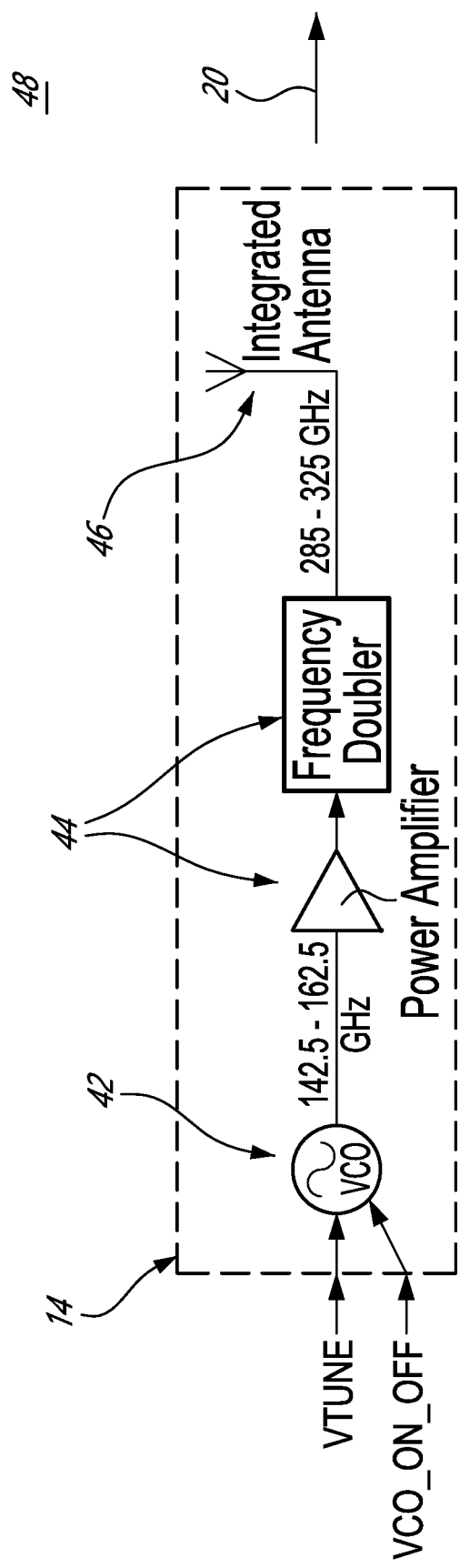
FIG. 7 is a block diagram of an example of one of the terahertz radiation emitting elements of a terahertz illumination source, in accordance with one or more embodiments.

FIG. 7 illustrates an example functional architecture of a THz emitting element 14 for emitting an individual THz radiation beam 20. In this embodiment, the THz emitting element 14 includes high-electron-mobility semiconductor materials, such as Si—Ge.

Moreover, for applications related to THz active imaging, the main elements in this architecture can be very-well suited for emitting a THz illumination beam 20 with reduced coherence. These elements include, from left-to-right, a voltage-controlled oscillator (VCO) 42, an amplifier-multiplier chain (AMC) 44, and an on-chip, patch-type antenna 46. In some embodiments, the AMC may comprise one or several power amplifiers and one or several frequency multipliers, such multipliers being typically frequency doublers or frequency triplers.

In this embodiment, the VCO 42 receives a control signal VTUNE, either fixed or time-varying, in order to emit an individual terahertz radiation beam 20 having a frequency within a given terahertz frequency band (e.g., including 285-to-325 GHz). The VCO 42 also has a digital VCO_ON_OFF input for turning-on or -off the emission of the THz radiation beam 20 for intensity modulation purposes in this specific embodiment.

As shown, the AMC 44 maps the VCO's 142.5-to-162.5 GHz output frequency band to the final 285-to-325 GHz output frequency band of the THz emitting element 14.

The on-chip, patch-type antenna 46 receives the output signal from the AMC 44 and radiates the corresponding individual terahertz radiation beam 20 in a medium 48 outside the THz emitting element 14.

It is noted here that the THz frequency values like those just mentioned above or elsewhere in this disclosure are for exemplary purposes and do not limit the scope of this disclosure which is intended to be applicable to any frequencies in the so-called THz range from 0.1 THz to 10 THz.

Figure 8:
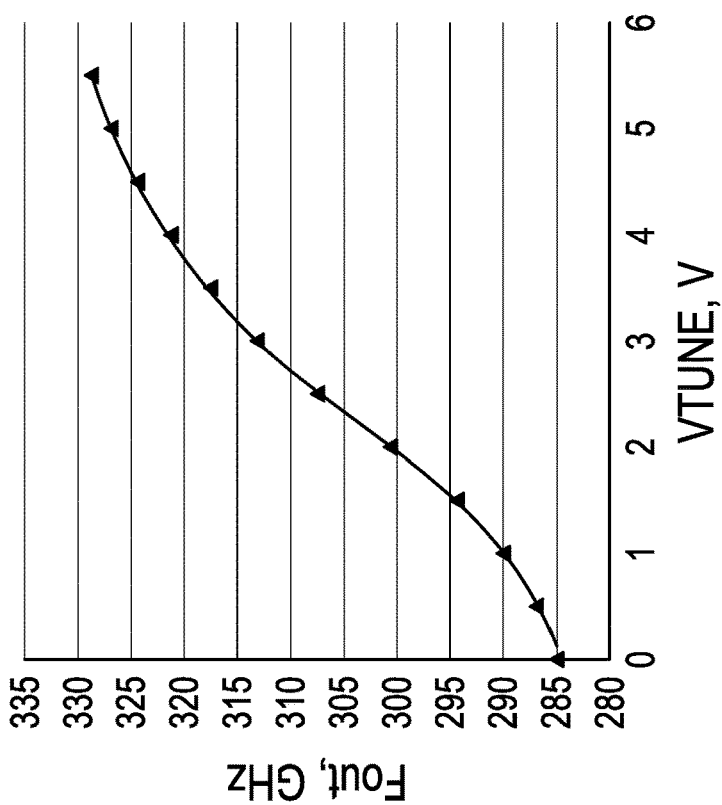
FIG. 8 is a graph showing output terahertz frequency Fout as a function of a voltage VTUNE of a control signal supplied to the terahertz radiation emitting element of FIG. 7, in accordance with one or more embodiments.

FIG. 8 shows a graph of the output characteristics of the frequency Fout as a function of the control signal VTUNE input voltage of the THz emitting element 14. As illustrated, the output bandwidth is 40 GHz.

Those skilled in the art of THz active imaging may be well aware that coherence reduction performed electronically is capable of producing images with an acceptable quality without the need to place active or passive path dispersive optical elements such as diffusers in the optical train of the illumination system.

Figure 9:
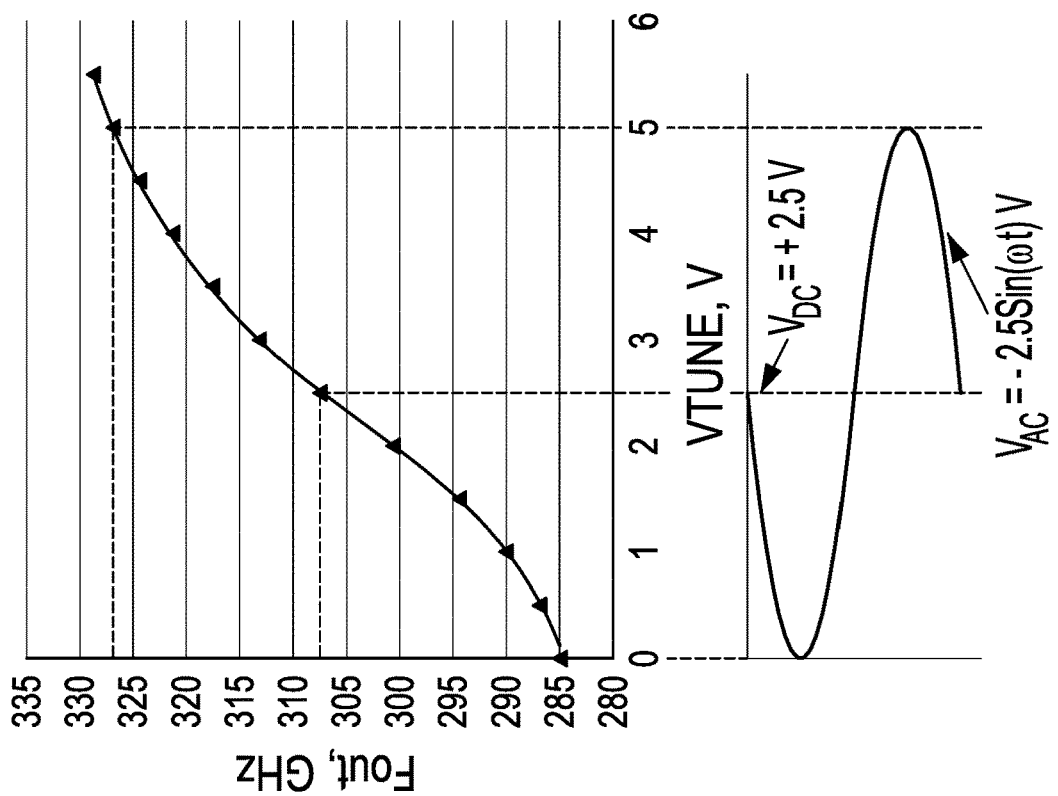
FIG. 9 is a graph showing output terahertz frequency Fout as a function of a voltage VTUNE of a control signal supplied to the terahertz radiation emitting element of FIG. 7, where electronic coherence reduction is depicted by periodically sweeping the output terahertz frequency Fout over time, in accordance with one or more embodiments.

As illustrated in FIG. 9, electronic coherence reduction acts on the wavelength of emitted radiation in order to widen the bandwidth of the THz illumination source 10. This can be done by rapidly changing the frequency (equivalently, the wavelength) of the individual terahertz radiation beams in order to produce significant diversity of the source wavelength during the time scale of the acquisition period of the imaging sensor used in a terahertz imaging system. The wavelength (or frequency) sweep is implemented by supplying a time-varying control signal to the THz emitting element 14. More specifically, the control signal can be provided in the form of an electric bias signal at the VTUNE input of the THz emitting element 14. This bias signal can be typically a voltage bias comprising a constant (DC) voltage term to which is added arithmetically a variable, periodic (AC) voltage term with frequency ω radian/sec; for example, a sinusoidal term.

Such a sum of AC and DC voltages at the VTUNE input results in a variable, periodic sweeping of the output frequency ranging from 285 GHz to 325 GHz. Provided that the frequency ($\omega/2\pi$) Hz of the AC term is significantly higher than the frame rate of the camera in the THz imaging system, the periodic sweeping of the THz frequency averages out on a frame-by-frame basis the adverse effects of speckle and interference caused by the otherwise highly coherent single-tone wave output of the THz emitting element 14 (or any coherent THz source). In fact, periodic sweeping of the THz output frequency over a band of 40 GHz can be nearly equivalent to illuminating a scene with a source having an emitting bandwidth of 40 GHz and corresponding reduced coherence.

Similar or better reduction of coherence can be obtained by driving the VTUNE input of the VCO with a random or an arbitrary periodic signal with greater diversity of values during the acquisition period of the image sensor.

On the other hand, for applications where coherent noise may not be an issue, for example, transmission imaging through planar, smooth and homogeneous objects, all the THz emitting elements 14 in the array 24 can operate in monochromatic mode by driving all their VTUNE inputs with a single DC voltage value.

In addition to the advantageous aspects stated so far, it is appropriate to mention that other THz integrated circuits can operate over frequency bands that differ from the 285 GHz-325 GHz band considered in the preceding example. For example, THz integrated circuits with nominal frequencies of 400 GHz and 500 GHz, both with a 40 GHz sweep bandwidth, can also be considered. As a result, it is possible to combine into a single array 24 different THz emitting elements 14 operating over different frequency bands. All those THz emitting elements 14 can be operated simultaneously to obtain a wider overall emission waveband and reduced coherence. Such a larger waveband can be useful to ease transmission through-, or reflection on materials with narrow transmission or reflection bandwidth. The THz emitting elements 14 can also be operated in a time sequence where only those of the first waveband emit for a certain time, followed by those of the second waveband and so on. By synchronizing the emission with the image acquisition according to the waveband, the spectral response of the scene can be extracted to obtain polychromatic or hyperspectral images with improved interpretability in comparison with monochromatic counterpart.

A flat spectral response is highly desirable for polychromatic or hyperspectral applications. In such applications, the spectral response of an optical system depends mainly on the spectral sensitivity of the sensor and on the spectral transmission or reflection of the optical elements. For an active system, the ability to extract the spectral characteristics of the objects present in a scene depends also on the spectrum of the corresponding THz illumination source 10. The non-uniform intrinsic spectral characteristics of the system (source, optics and sensor) can be taken into account through calibration process and compensation digital processing. However, the compensation techniques can have limitations and better results can be achieved from a system having a flatter spectral response. The use of a plurality of THz emitting elements 14 can offer a means to compensate such spectral discrepancies. Hence for spectral applications, the array would be populated by different numbers of the THz emitting elements 14 emitting in the different wavebands in a manner to produce the overall flattest spectral response as possible. The flattening of the spectral response can also be done by operating some of the THz emitting elements 14 a fraction of the time of the integration period of the image sensor.

The intensity modulation capability of the THz emitting elements 14 can allow implementation of heterodyne (or similar) schemes of signal detection provided that a fast response sensor is used in conjunction with the modulated THz emitting elements 14. The useful signal is extracted from the sensor output signal through filtering that can reject most of the frequencies out of a narrow band centered on the modulation frequency of the THz emitting elements 14. The concept may be extended to allow the simultaneous acquisition over all the wavebands in polychromatic or hyperspectral applications. For such applications, the THz emitting elements 14 emitting in a given waveband are all modulated in intensity at the same frequency, which differs from the modulation frequencies used for operation over the other wavebands. All the THz emitting elements 14 are driven simultaneously and the sensor receives all the waveband optical signals differentiated from each other by their specific frequency at which the intensity is modulated. The signal from each individual waveband can be extracted by filtering the sensor composite signal.

In some embodiments, the individual beam shaping elements 28 can be refractive. For instance, the individual beam shaping elements can be provided in the form of conventional lenses, liquid crystal lenses and the like. The individual beam shaping elements can also be reflective in some other embodiments. In these embodiments, the individual beam shaping elements can have a reflective surface reflecting corresponding individual terahertz radiation beams. The collective beam shaper 29 can be refractive as well. For instance, the collective beam shaper can be provided in the form of a conventional lens, a liquid crystal lens and the like. In some other embodiments, the collective beam shaper can be reflective, and be provided with at least a reflective surface.

Figure 10:
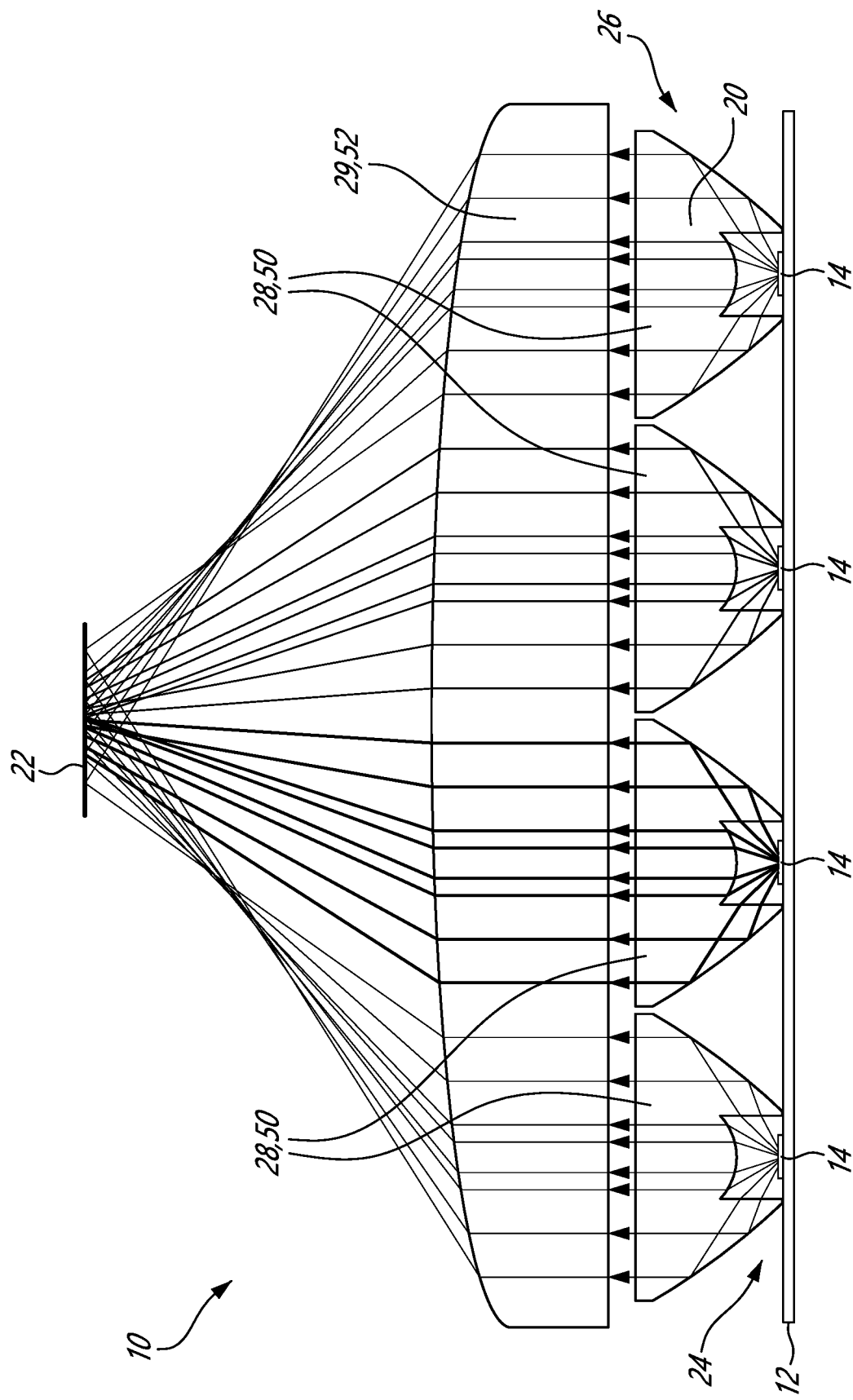
FIG. 10 is a side elevation view of an array of terahertz radiation emitting elements optically coupled to an example beam shaping assembly, including refractive beam shaping elements and a collective beam shaper, in accordance with one or more embodiments.

FIG. 10 shows an example beam shaping assembly including an individual beam shaping element 28 placed in front of each THz emitting element 14 of the array 24 located underneath. The array 26 of beam shaping elements 28 can be provided in the form of an assembly of simple or complex lenses 50, each assembly collecting the terahertz radiation beam emitted from the corresponding individual THz emitting element 14 and reducing the beam divergence. More complex beam shaping elements, either refractive or reflective, with combinations of conventional, free-from and arbitrary surfaces may also be envisioned such as those used for light emitting diodes (LEDs). The configuration of the beam shaping elements 28 can be the same for each terahertz emitting element 14 of the array 24 or individualized as a function of the position of the associated terahertz emitting element 14 (or the group of THz emitting elements 14) to control the radiated optical irradiance distribution and/or for any other purposes (e.g., polarization or phase distribution).

The array 26 of beam shaping elements 28 can be mounted on a two-axis translation stage to move the array 26 with respect to the array 24 of THz emitting elements 14 in order to increase ray directions diversity and further reduce the coherence of the terahertz illumination source 10. The beam shaping assembly can also include a large collective beam shaper 29 placed at the output of the array 26 of beam shaping elements 28 for further shaping of the terahertz illumination beam 22. For example, the collective beam shaper 29 can be provided in the form of a converging lens 52 to focus the individual terahertz radiation beams produced by all the individual channels (individual THz emitting elements 14 with corresponding beam shaping elements 28) into a single spot. Other beam shaping elements 28 such as light pipes, arrays of lenses (beam homogenizers), integrating spheres can be used to mix the individual terahertz radiation beams produced by the array 24 of THz emitting elements 14 in order to improve uniformity and compensate for variations in the output power from element to element 14 (or dead emitters).

Still referring to FIG. 10, the array 24 may include THz emitting elements 14 emitting in distinct wavebands to produce a terahertz illumination source with a wider waveband and/or to allow spectral analysis functionalities. Those THz emitting elements 14 can be activated simultaneously or sequentially in time according to their position in the array, emission waveband and/or any other specificity.

In order to populate as densely as possible the surface with THz emitting elements 14, the electronic control hardware of the VTUNE bias input of the THz emitting elements 14 is located preferably below the surface 12, and is comprised within the control signal generator 16.

Figure 11:
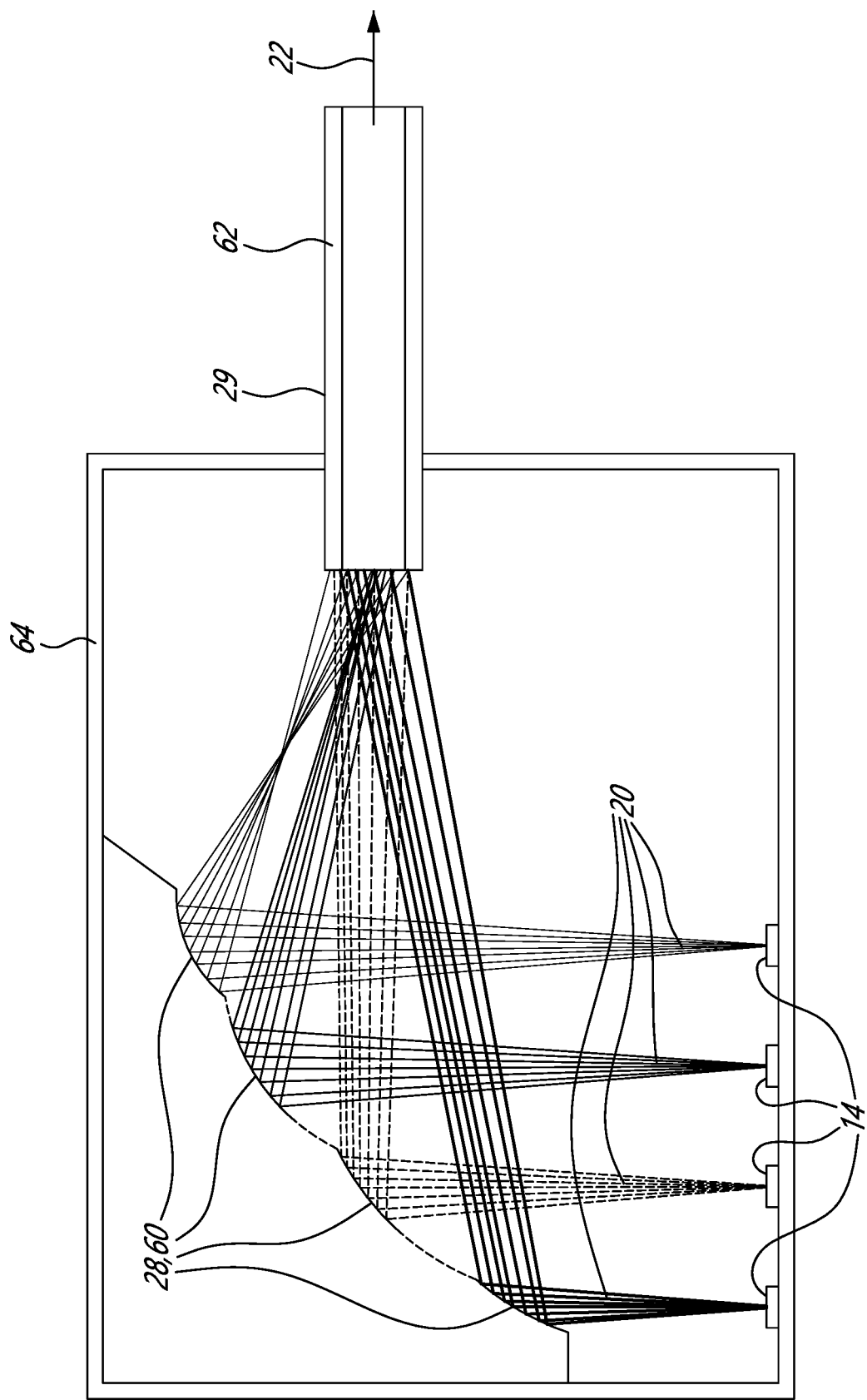
FIG. 11 is a side elevation view of an array of terahertz radiation emitting elements optically coupled to another example beam shaping assembly, including reflective beam shaping elements and a collective beam shaper, in accordance with one or more embodiments.

FIG. 11 shows another example of a beam shaping assembly. In this embodiment, the individual beam shaping elements 28 are reflective. More specifically, the individual beam shaping elements 28 can have reflective surfaces 60 which can collect and redirect the individual terahertz beams 20 towards a collective beam shaper 29. In this embodiment, the collective beam shaper 29 is provided in the form of a light pipe or waveguide 62 guiding the individual terahertz beams 22 to form a terahertz illumination beam 22. In this example, the individual beam shaping elements 28 and the collective beam shaper 29 are mounted to a frame 64 which can be permanently or removably coupled to the array of THz emitting elements 14.

Figure 12:
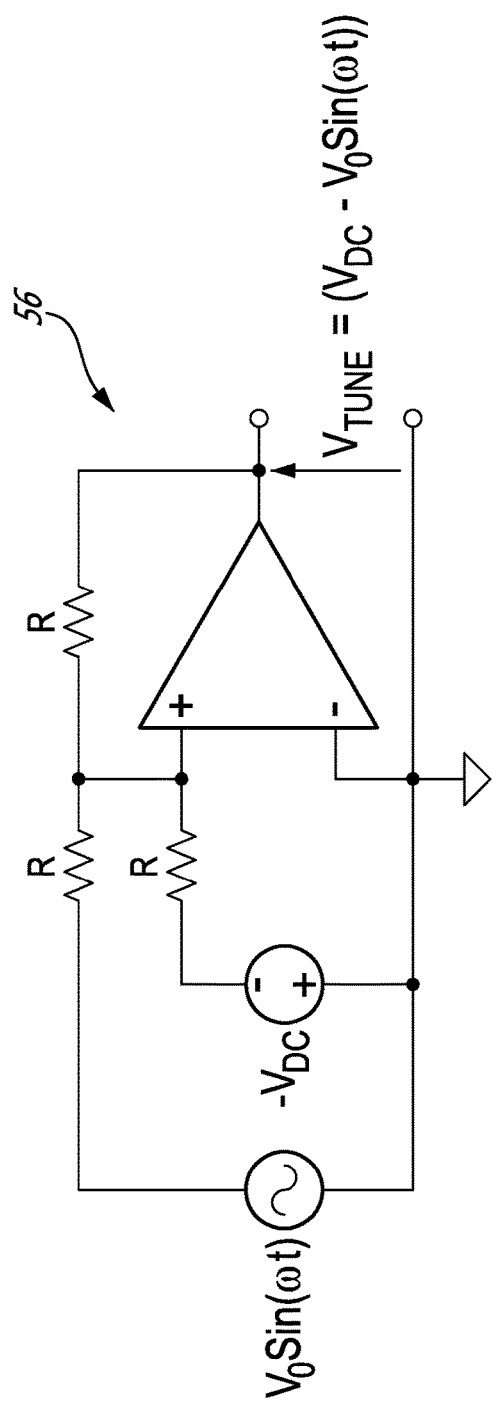
FIG. 12 is a schematic view of an example of an electronic circuit generating an exemplary control signal, the control signal oscillating over time, in accordance with one or more embodiments.

FIG. 12 illustrates a typical electronic circuit 56 for generating the VTUNE bias signal forwarded to each of the THz emitting elements 14. The output is the sum of a DC term, $V_{DC}$, and an AC term, $-V_0 \sin(\omega t)$. In reference to the example depicted in FIG. 9, both values of the DC amplitude $V_{DC}$ and the AC amplitude $V_0$ can be adjustable to set, respectively, the center frequency and the bandwidth (range) of the frequency sweep signal. Obviously, a single instance of this circuit can be sufficient for driving all the M×N VTUNE inputs of the terahertz emitting elements at the same time, either with a constant or a periodic VTUNE signal. For example, and as was already pointed out above, for imaging applications where coherent noise may not be an issue, like in transmission imaging through planar, smooth and homogeneous objects, the terahertz emitting elements can be used in monochromatic mode simply by setting a non-zero DC term value $V_{DC}$ and a zero AC amplitude $V_0$, in order to set a control signal having a voltage VTUNE=$V_{DC}$ at the input of all the terahertz emitting elements in the array.

Figure 13:
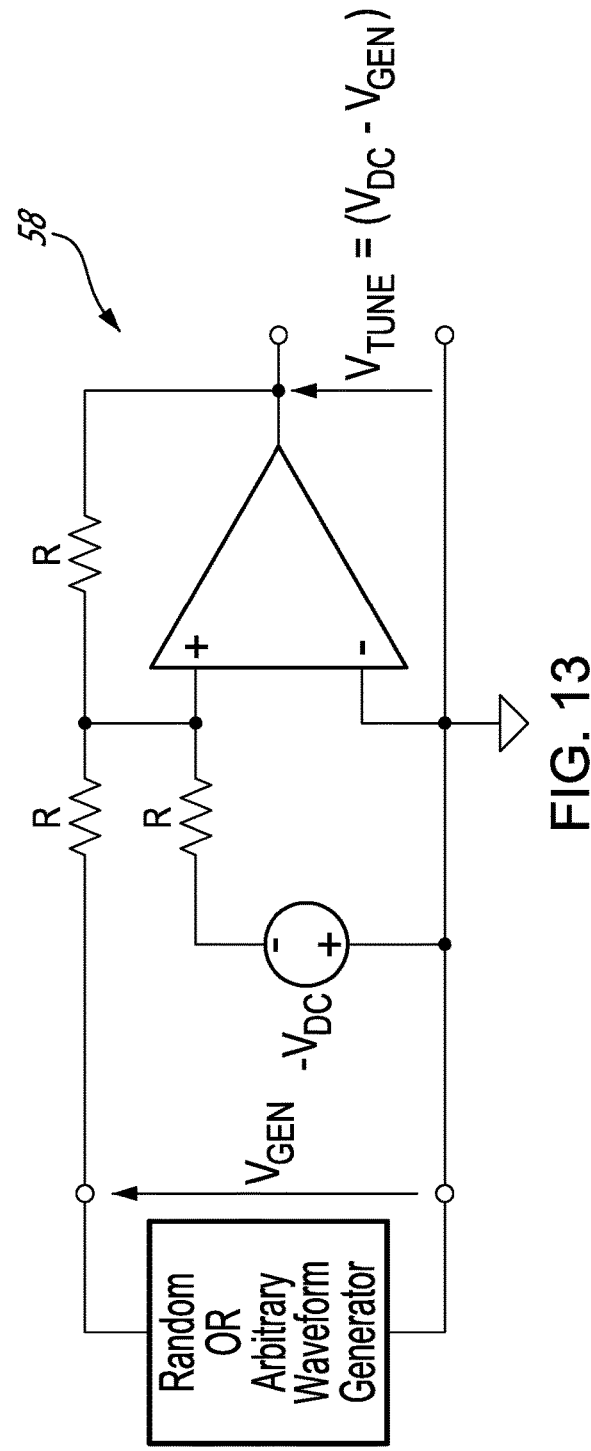
FIG. 13 is a schematic view of another example of an electronic circuit generating an exemplary control signal, the control signal varying randomly or arbitrarily over time, in accordance with one or more embodiments.

A more versatile, more general electronic circuit like the one shown at 58 in FIG. 13 may also be considered for generating the drive signal of the VTUNE input of the THz emitting elements 14. The difference with the circuit in FIG. 12 is that the simple sine wave generator therein is now replaced by a random or arbitrary waveform generator in order to drive the THz emitting elements 14 with a time-varying control signal having a greater diversity of voltage values during an acquisition period of a terahertz image sensor. In this embodiment, the VTUNE signal is now expressed as a sum of a constant DC term $V_{DC}$ and a term defined as $V_{GEN}$ having a time-varying amplitude:

$$\text{VTUNE}=V_{DC}-V_{GEN}(t),$$

where the amplitude of $V_{GEN}(t)$ may vary randomly or, for example, periodically, as a sum of a number Q of the first terms of a Fourier series such as:

$$V_{GEN}=\Sigma_{q=1}^{Q} A_q \cos(q \omega t)+B_q \sin(q \omega t),$$

with adjustable or randomly variable amplitude coefficients $A_q$, $B_q$ and fundamental sweep frequency ($\omega/2\pi$) Hz.

It was also pointed out above that it is possible to combine into a given array a plurality of THz emitting elements 14 operating at different frequency (wavelength) bands. All those elements can be operated simultaneously to obtain a wider overall emission waveband and, therefore, much reduced coherence. A similar, multi-frequency, multi-waveband approach is also suitable for polychromatic or hyperspectral applications.

Figure 14:
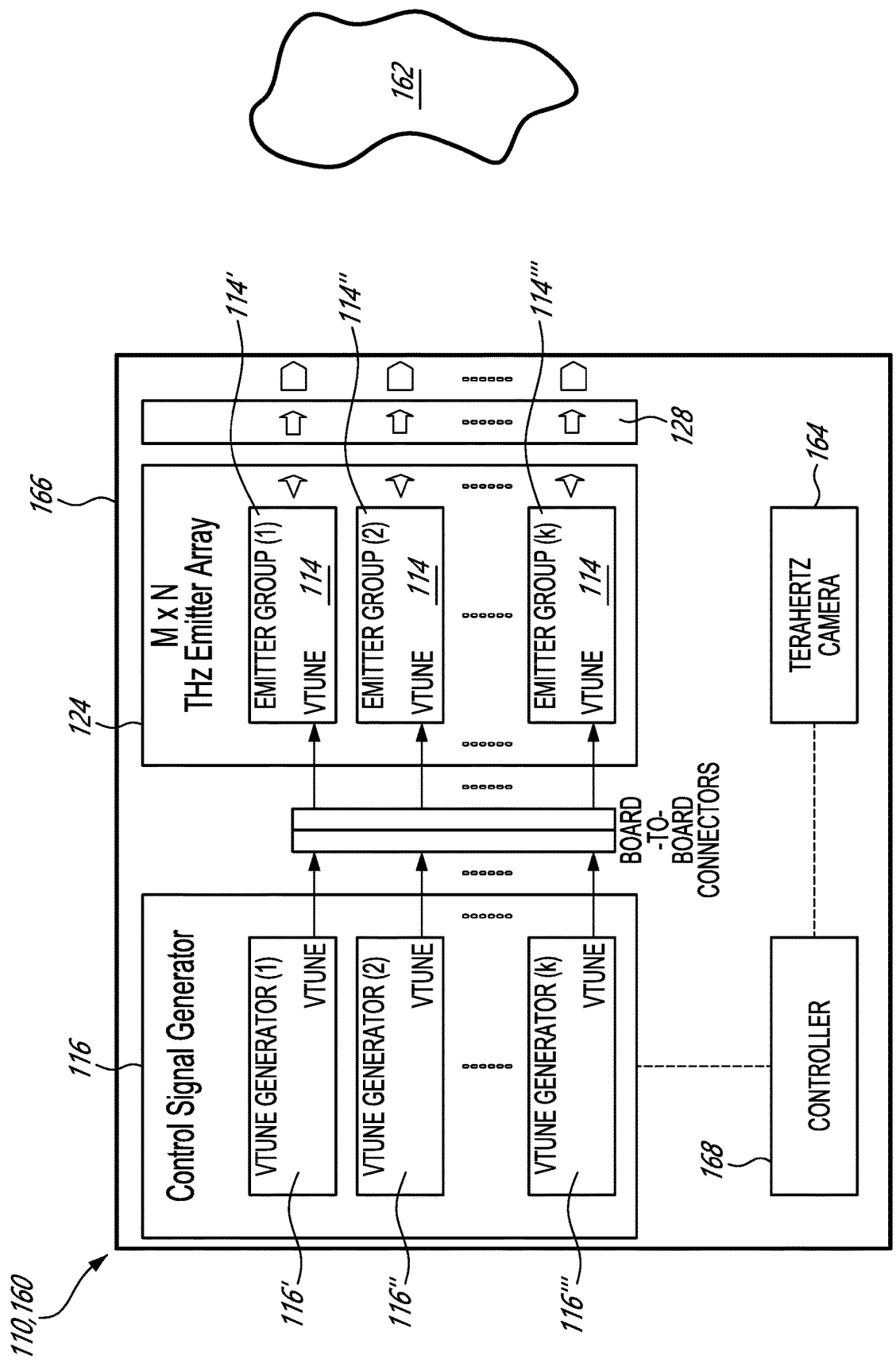
FIG. 14 is a block diagram of another example of a terahertz illumination source, with terahertz radiation emitting elements being partitioned in a number of groups each receiving a corresponding control signal, in accordance with one or more embodiments.

In order to implement this functionality, the architecture of a THz illumination source 110 would be as shown in FIG. 14, where the M×N array 124 of THz emitting elements 114 would be partitioned into k groups of THz emitting elements 114, with the number k being selected such that:

$$1 \leq k \leq (M \times N),$$

where k, M and N are integers, and the groups are illustrated at 114', 114" and 114''' in this specific example.

The corresponding control signal generator 116 shown on the left-hand side of FIG. 14 would include k control signal generators 116', 116" and 116''', each of these control signal generators driving the common VTUNE input of a corresponding group of THz emitting elements 114 in the array 124. This VTUNE input would be used for driving the VCO VTUNE input of each of the THz emitter elements 114 in this group 114. Each control signal generator 116', 116" and 116''' could be implemented either as the simple sinusoidal oscillator like the one shown in FIG. 12, or a random or arbitrary waveform generator such as the one shown in FIG. 13.

In the latter case, where $$\text{VTUNE}=V_{DC}-V_{GEN}$$

and $$V_{GEN}=\Sigma_{q=1}^{Q} A_q \cos(q \omega t)+B_q \sin(q \omega t),$$

the $V_{DC}$ value, the amplitude coefficients $A_q$, $B_q$ and fundamental sweep frequency ($\omega/2\pi$) Hz would be adjustable independently of the values set in the other instances of this type of control signal generator.

Further flexibility in implementing programmable or more sophisticated techniques or algorithms of electronic coherence reduction may be added by installing also on the control signal generator a programmable device like a microcontroller or a field programmable gate array (FPGA) as well as a communication port for control from a remote computer.

It is noted that the THz illumination source 110 can be part of a terahertz imaging system 160. In such embodiments, the THz imaging system 160 has a THz illumination source 110 illuminating a scene 162 and a terahertz camera 164 imaging at least a portion of the illuminated scene 162. In some embodiments, the THz illumination source 110 and the terahertz camera 164 are both mounted to a frame 166. The frame 166 can differ from one embodiment to another. For instance, the frame 166 can be provided in the form of an enclosure, a table, and the like. The frame 166 is optional as it could be omitted in some embodiments. As shown, the THz imaging system 160 can include a controller 168 configured to control the THz illumination source 110 and/or the THz camera 164. For instance, in some embodiments, the controller 168 can send instructions to the THz illumination source 110, and more specifically to the control signal generators 116', 116", 116''', to generate control signals of appropriate characteristics. In some embodiments, the controller 168 can control the terahertz camera 164 to acquire images with given parameters (e.g., acquisition time) and then receive the so-acquired images from the terahertz camera 164. The controller 168 can be configured to process, manipulate, communicate, store the images as desired.

The control signal generator 116 and/or the controller 168 can be provided as a combination of hardware and software components. Such hardware components can be implemented in the form of a computing device 170, an example of which is described with reference to FIG. 15.

Figure 15:
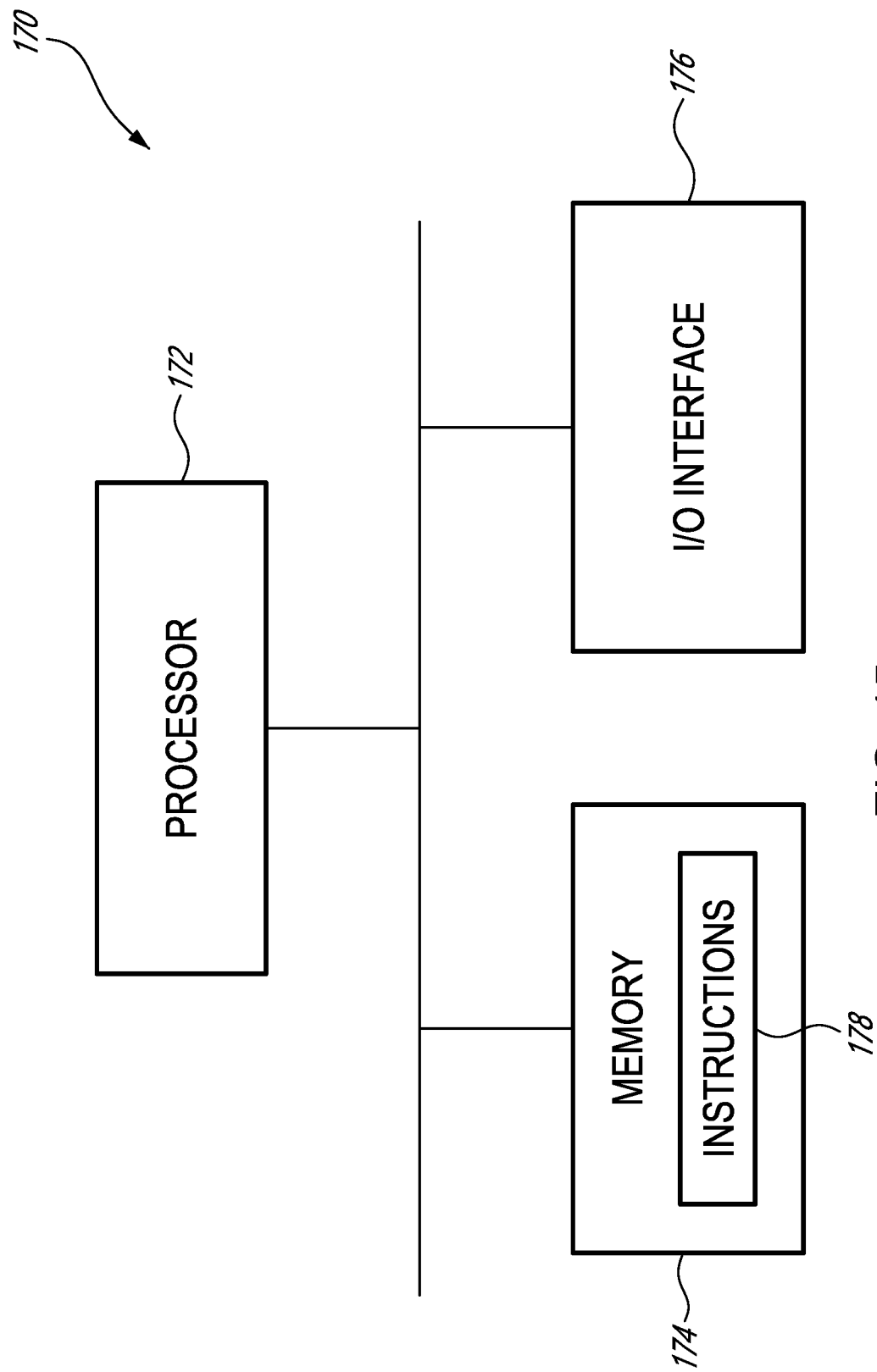
FIG. 15 is a schematic view of an example of a computing device of the control signal generator of FIG. 1, in accordance with one or more embodiments.

Referring to FIG. 15, the computing device 170 can have a processor 172, a memory 174, and an I/O interface 176. Instructions 178 for supplying control signals to all or a fraction of the THz emitting elements 114 can be stored on the memory 174 and accessible by the processor 172.

The processor 172 can be, for example, a general-purpose microprocessor or microcontroller, a digital signal processor (DSP), an integrated circuit, a field programmable gate array (FPGA), a reconfigurable processor, a programmable read-only memory (PROM), or any combination thereof.

The memory 174 can include a suitable combination of any type of computer-readable memory that is located either internally or externally such as, for example, random-access memory (RAM), read-only memory (ROM), compact disc read-only memory (CDROM), electro-optical memory, magneto-optical memory, erasable programmable read-only memory (EPROM), and electrically-erasable programmable read-only memory (EEPROM), Ferroelectric RAM (FRAM) or the like.

Each I/O interface 176 enables the computing device 170 to interconnect with one or more input devices or with one or more output devices.

Each I/O interface 176 enables the control signal generator 116 and/or the controller 168 to communicate with other components, to exchange data with other components, to access and connect to network resources, to serve applications, and perform other computing applications by connecting to a network (or multiple networks) capable of carrying data including the Internet, Ethernet, plain old telephone service (POTS) line, public switch telephone network (PSTN), integrated services digital network (ISDN), digital subscriber line (DSL), coaxial cable, fiber optics, satellite, mobile, wireless (e.g. W-Fi, WiMAX), SS7 signaling network, fixed line, local area network, wide area network, and others, including any combination of these.

The computing device 170 described above is meant to be only an example. Other suitable embodiments of the computing device 170 can also be provided, as it will be apparent to the skilled reader.

Figure 16:
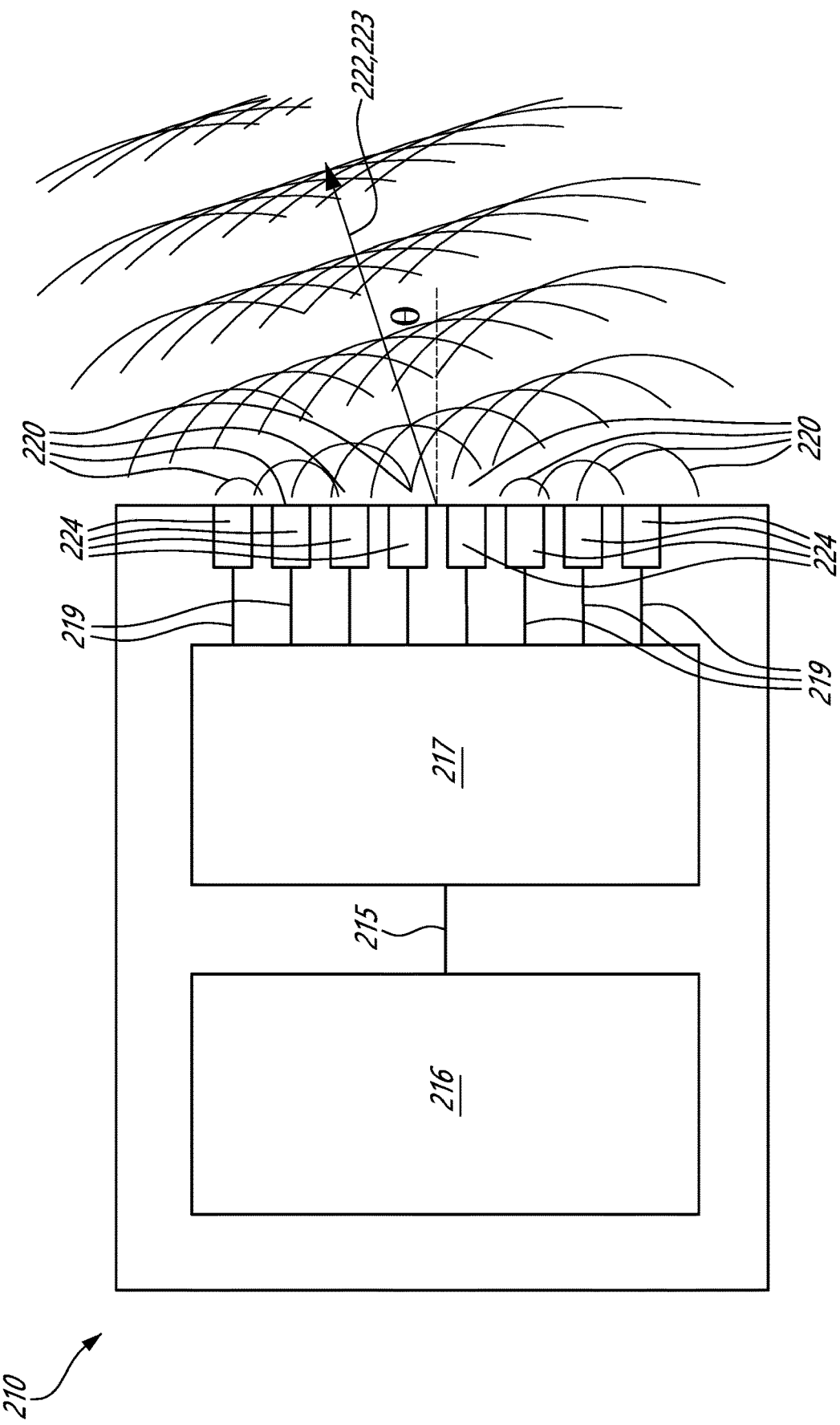
FIG. 16 is a schematic view of another example of a terahertz illumination source, shown with a phase delayer to provide a phased-array terahertz illumination beam, in accordance with one or more embodiments.

In another aspect, FIG. 16 shows an example of a terahertz illumination source 210 configured to emit a terahertz illumination beam 222 for terahertz imaging.

As shown, the terahertz illumination source 210 has terahertz radiation emitting elements 224, a control signal generator 216 generating a main control signal 215 and a phase delayer 217. In this specific embodiment, the phase delayer 217 is configured to receive the main control signal 215 from the control signal generator 216 and to generate control signals 219 based on the main control signal 217. As can be appreciated, in this embodiment the control signals 219 have phase delays relative to one another. As such, the control signal generator 216 can modulate the phases of the individual terahertz illumination beams to control a resulting, collective terahertz illumination beam 222. Accordingly, the terahertz illumination beam 222 can be a phased-array terahertz illumination beam 223. As shown, the individual terahertz radiation beams 220 are emitted such that the terahertz illumination beam 222 can be steered at a given angle θ towards a target. In some other embodiments, the terahertz illumination beam 222 can be focused, defocused, scanned or otherwise manipulated as phased-array technologies may permit. In some embodiments, the phased-array terahertz illumination beam 223 can be scanned at a given frequency across a given scene within the acquisition time of a terahertz camera. By doing so, terahertz images of reduced coherent noise can be acquired even if the phased-array terahertz illumination beam 223 is itself coherent.

Such phased-array signature can be obtained by providing phase delays to the control signals 219 supplied to the terahertz radiation emitting elements 224. Other embodiments may apply. For instance, in some other embodiments, the phase delayer may receive control signals from the control signal generator and phase delay each control signals relative to one another. By supplying these phased-delayed control signals to the terahertz radiation emitting elements 224, any desired phased-array terahertz illumination beam 223 may be emitted. Other ways of providing controls signals of delayed phase to the radiation emitting elements 224 can be used, as may be appreciated by the skilled reader.

It is intended that, in some embodiments, the terahertz illumination beam 222 can have a coherence property above a given coherence property threshold. In other words, the terahertz illumination source 210 can be used to emit a coherent illumination terahertz beam. Moreover, the terahertz illumination beam 222 can have a coherence property which can vary over time. As such, the terahertz illumination source 210 can be used whenever a terahertz illumination beam 220 of controlled coherence is to be emitted towards a scene.

In some embodiments, the terahertz illumination source 210 has individual beam shaping elements which are optically coupled to a respective one of the terahertz radiation emitting elements 224, and a collective beam shaper which is optically coupled to at least some the individual beam shaping elements. In these embodiments, the individual terahertz radiation beams are collected and redirected successively by the individual beam shaping elements and the collective beam shaper.

As can be understood, the examples described above and illustrated are intended to be exemplary only. The scope is indicated by the appended claims.

What is claimed is:

1. A terahertz illumination source for terahertz imaging, the terahertz illumination source comprising:
    a surface;
    a plurality of terahertz radiation emitting elements mounted to said surface;
    a plurality of individual beam shaping elements each being optically coupled to a respective one of said terahertz radiation emitting elements;
    a collective beam shaper optically coupled to at least some of said individual beam shaping elements; and
    a control signal generator communicatively coupled to said terahertz radiation emitting elements, said control signal generator supplying a plurality of control signals to said terahertz radiation emitting elements, said plurality of terahertz radiation emitting elements emitting a plurality of individual terahertz radiation beams being collected and redirected successively by said individual beam shaping elements and said collective beam shaper, at least one of said terahertz radiation emitting elements and said control signals being configured so that said individual terahertz radiation beams are incoherent with respect to one another.

2. The terahertz illumination source of claim 1 wherein at least one of said individual beam shaping elements and said collective beam shaper is refractive.

3. The terahertz illumination source of claim 1 wherein said individual beam shaping elements are stacked on respective ones of said individual terahertz radiation emitting elements.

4. The terahertz illumination source of claim 1 wherein said collective beam shaper is stacked on corresponding individual beam shaping elements.

5. The terahertz illumination source of claim 1 wherein said individual terahertz illumination beams form a terahertz illumination beam having a nominal wavelength and a coherence length below about a hundred times said nominal wavelength.

6. The terahertz illumination source of claim 5 wherein said control signals are different from one another so as to provide individual terahertz radiation beams of different wavelengths, thereby reducing said coherence length of said terahertz illumination beam.

7. The terahertz illumination source of claim 5 wherein at least some of said terahertz radiation emitting elements are configured to emit individual terahertz radiation beams of different spectral contents, thereby reducing said coherence length of said terahertz illumination beam.

8. The terahertz illumination source of claim 1 wherein said terahertz radiation emitting elements include a high-electron-mobility semiconductor material.

9. A terahertz illumination source for terahertz imaging, the terahertz illumination source comprising:
a surface;
a plurality of terahertz radiation emitting elements mounted to said surface; and
a control signal generator communicatively coupled to said terahertz radiation emitting elements, the control signal generator supplying a plurality of control signals to said terahertz radiation emitting elements, said plurality of terahertz radiation emitting elements emitting a plurality of individual terahertz radiation beams, the control signal generator modulating a phase of said individual terahertz illumination beams to control a resulting, collective terahertz illumination beam.

10. The terahertz illumination source of claim 9 wherein said modulating causes said collective terahertz illumination beam to be steered towards a target.

11. The terahertz illumination source of claim 9 wherein said modulating causes said collective terahertz illumination beam to be focused towards a target.

12. The terahertz illumination source of claim 9 wherein said terahertz radiation emitting elements include a high-electron-mobility semiconductor material.

13. The terahertz illumination source of claim 9 further comprising a plurality of individual beam shaping elements each being optically coupled to a respective one of said terahertz radiation emitting elements, and a collective beam shaper optically coupled to at least some said individual beam shaping elements, said individual terahertz radiation beams being collected and redirected successively by said individual beam shaping elements and said collective beam shaper.

14. The terahertz illumination source of claim 13 wherein at least one of said individual beam shaping elements and said collective beam shaper are refractive.

15. The terahertz illumination source of claim 13 wherein said individual beam shaping elements are stacked on respective ones of said individual terahertz radiation emitting elements.

16. The terahertz illumination source of claim 13 wherein said collective beam shaper is stacked on corresponding individual beam shaping elements.

17. The terahertz illumination source of claim 9 further comprising a phase delayer receiving a main control signal from the control signal generator and generating the plurality of control signals based on the main control signal such that the plurality of control signals have phase delays relative to one another.

18. The terahertz illumination source of claim 9 further comprising a phase delayer receiving the plurality of control signals from the control signal generator and phase delaying the plurality of control signals from one another such that the plurality of control signals have phase delays relative to one another.

* * * * *